United States Patent [19]

Solie

[11] 4,055,820
[45] Oct. 25, 1977

[54] REFLECTIVE DOT ARRAY FOR ACOUSTIC WAVE PROCESSING

[75] Inventor: Leland P. Solie, Acton, Mass.

[73] Assignee: Sperry Rand Corporation, New York, N.Y.

[21] Appl. No.: 638,117

[22] Filed: Dec. 5, 1975

[51] Int. Cl.² .................. H03H 9/04; H03H 9/26; H03H 9/30; H03H 9/32

[52] U.S. Cl. .................. 333/30 R; 310/366; 333/72

[58] Field of Search .................. 333/72, 30 R, 71; 310/8-8.3, 9.7, 9.8; 331/107 A; 330/5.5; 235/181; 29/25.35, 594

[56] References Cited

U.S. PATENT DOCUMENTS

| 3,781,717 | 12/1973 | Kuenemund | 333/72 X |
|---|---|---|---|
| 3,883,831 | 5/1975 | Williamson et al. | 333/30 R |
| 3,970,970 | 7/1976 | Worley | 333/72 |
| 3,975,697 | 8/1976 | Paige | 333/30 R |
| 3,978,437 | 8/1976 | Paige | 333/72 |

OTHER PUBLICATIONS

Mason et al., "Physical Acoustics" vol. VII, Academic Press, New York 1970; Title page and pp. 229–233.
Microwave Journal "Horizen House", Dedham, Mass., Jan. 1974; Title page and p. 10.

Primary Examiner—Alfred E. Smith
Assistant Examiner—Marvin Nussbaum
Attorney, Agent, or Firm—Howard P. Terry; Seymour Levine

[57] ABSTRACT

An apparatus for processing acoustic signals wherein an array of discrete scatterers on a substrate reflect an incident acoustic surface wave on the substrate in accordance with a predetermined transfer function which is established by the size and spacing of the scatterers within the array. The scatterers, and input and output transducers, may all be metalized on the surface of the substrate with a single mask, thus providing an economical means of construction.

25 Claims, 3 Drawing Figures

REFLECTIVE DOT ARRAY FOR ACOUSTIC WAVE PROCESSING

BACKGROUND OF THE INVENTION

1. Field of the Invention

The present invention relates generally to acoustic surface wave signal processors for processing electrical input signals and yielding modified output electrical signals and more particularly concerns such apparatus as delay lines, bandpass filters and pulse compression filters.

2. Description of the Prior Art

The surface wave devices capable of performing signal processing functions, such as bandpass filters and pulse compression filters, take several forms. Early designs utilizing surface waves generally employed multi-section interdigital transducers which give rise to a number of undersirable side effects such as wavefront distortion, multiple reflections, radiation, bulk wave generation, and variation of effective surface wave velocity across the array. These lead to spurious signals and investigations to minimize these effects led to designs which employ reflecting grooves oriented obliquely to the incident wave. In these designs, a reflecting groove or line reflects the surface wave incident thereto into some other acoustic track providing a relative delay of the reflected signal which depends upon the position of the line in the array. Arrangement of the lines is such that the reflections from adjacent lines will be in-phase in a given direction relative to the incident signal. In the simplest form, a single array of reflecting lines provides a processed signal at 90° relative to the incoming wave.

These systems are analogous to delay line processors wherein each groove corresponds to a tap on the delay line. Weighting factors to provide the desired signal processing are established by reflections from the grooves which vary with the depth of each groove. Though the device provides a high performance processor, the fabrication is relatively complicated, requiring two separate operations; the application of metallized strips to the substrate to form the transducer pattern; and the etching of the grooves in the array which must be precisely oriented with that of the transducer pattern. Furthermore, to vary the depth of the grooves, they must be ion beam etched in a process that varies the etching time according to the desired depth. This process is not easily adapted to mass production and results in a rather high unit cost. The purpose of this invention is to provide a reflective array processor that maintains the high level of performance of the prior art and may be economically fabricated.

SUMMARY OF THE INVENTION

A preferred reflective array processor constructed according to the principles of the present invention provides lines of discrete acoustic scatterers (dots) each with dimensions less than the wavelength to replace the etched grooves of the prior art. Since the scatters are of dimensions less than a wavelength, no currents flow therethrough and simple mechanical discontinuities exist thereat. Reflections from these scatterers do not depend upon a piezoelectric interaction and the effective tap weight for each line, which is related to the total reflection therefrom, is directly proportional to the number of scatterers thereon. The configuration maintains the advantages of the etched grooves and additionally provides greater freedom from distortion of the response caused by multiple reflections between the etched grooves.

DESCRIPTION OF THE PREFERRED EMBODIMENTS

Figure 1:
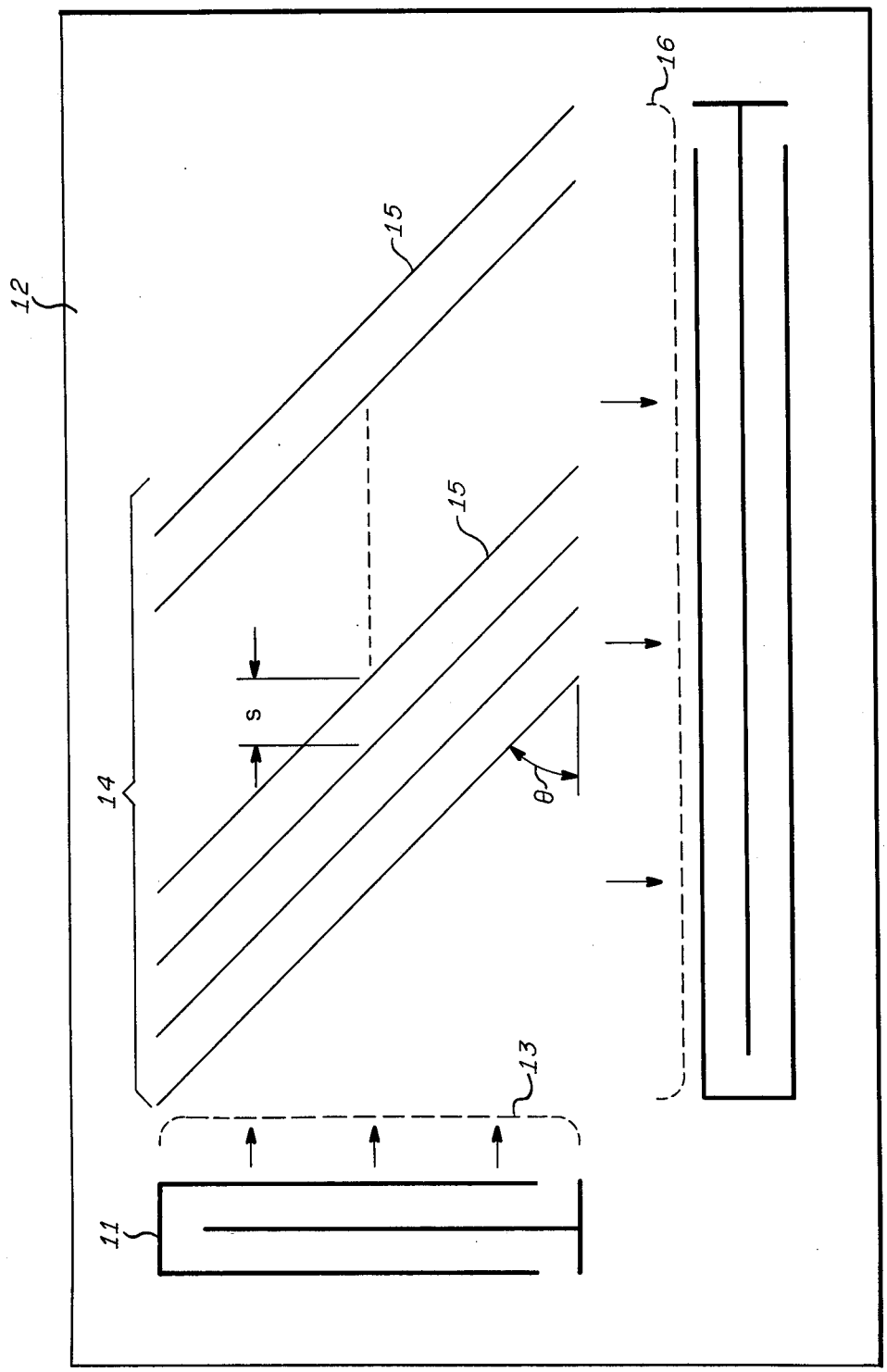
FIG. 1 is a plan view of a typical prior art reflective array.

FIG. 1 illustrates the general structure of a processor utilizing a reflective array as practived by the prior art. In this configuration, an input transducer 11 metalized on the surface of a substrate 12 launches a surface acoustic wave 13 which travels through an oblique grating 14 consisting of a multiplicity of grooves 15 etched on the surface of the substrate 12. The angle $\theta$ of the grooves relative to the direction of the propagation of the surface wave 13 and the spacing S, along the direction or propagation, between grooves are such as to establish a strong reflected wave 16 at a right angle to the launched wave 13 which propagates to an output transducer 17, that is also metalized on the surface of the substrate 12. Weighting factors, to provide the desired transfer function between the launched wave 13 and the reflected wave 16 are affected by varying the depth to which each of the grooves is etched.

Figure 2:
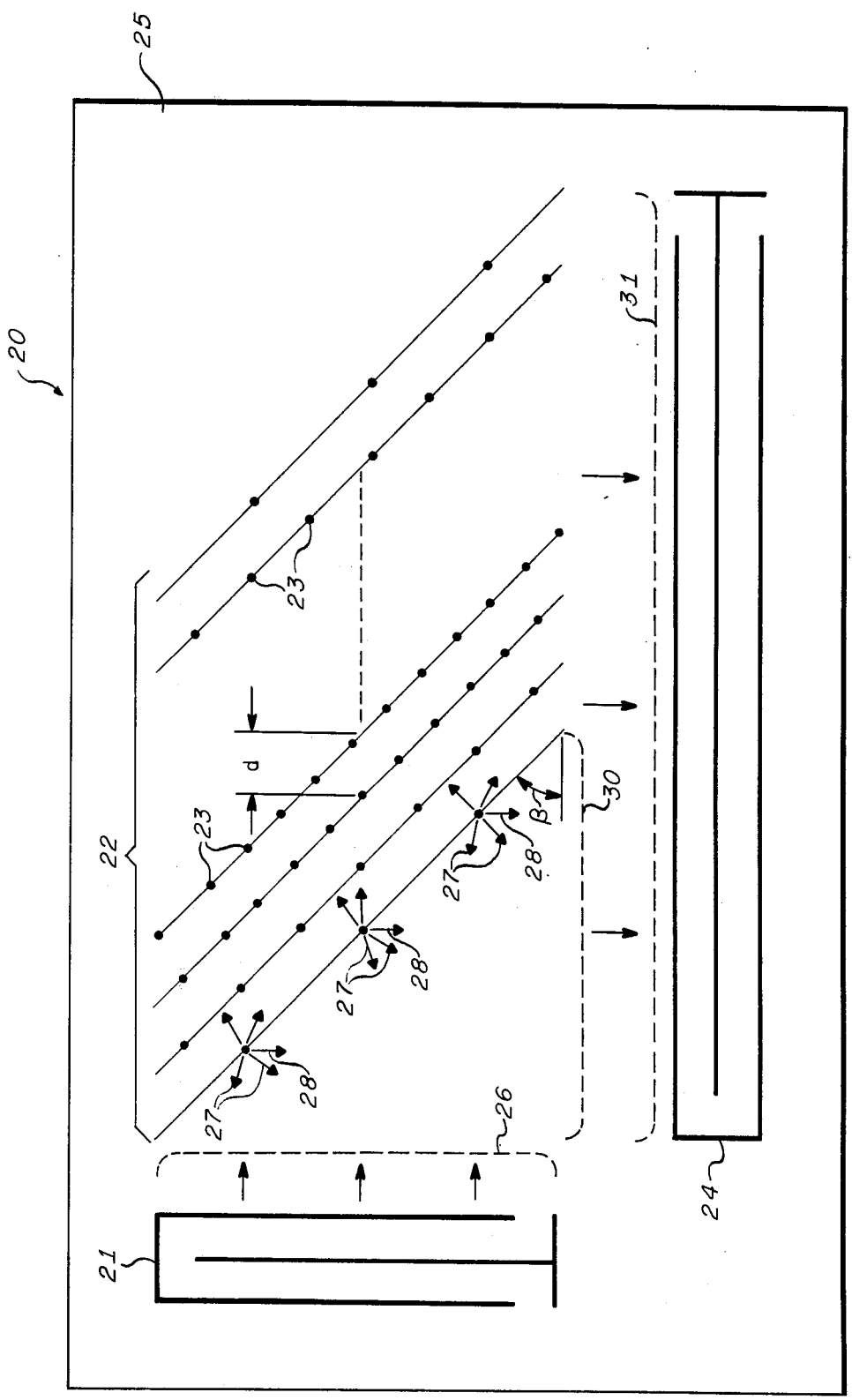
FIGS. 2 and 3 are plan views of a reflective dot arrays according to the present invention.

Referring now to FIG. 2, wherein is shown a reflective dot array 20 which comprises a tranducer 21, an array 22 of discrete scatterers 23, which may be cylinders or any other geometric shape of dimensions less than a wavelength that appears as dots, and an output transducer 24, all of which may be metallized on a substrate 25 which may be a piezoelectric material such as bismuth germanium oxide, bismuth silicon oxide, lithium tantalate or lithium niobate. The transducers 21 and 24 may be of the type comprising electrode pairs interdigitally positioned with alternating instantaneous polarities further described in U.S. Pat. No. 3,898,592 issued to L. P. Solie on Aug. 5, 1975 and assigned to the assignee of the instant invention. Each of the dots 23 are arranged on parallel lines, that form an angle $\beta$ with the direction of propagation of the incident wave, which is the Z axis of the substrate 25. The dots 23 may be uniformly or non-uniformly spaced along each of the parallel lines.

Transducer 21 launches an incident surface wave 26 which propagetes to the dot array 22. The incidence of the surface wave 26 on dot 23, the reflectivity of which varies with its size, causes reflections 27 essentially omni-directionally thereabout. Generally, the substrate is anisotropic and $V_x$, the propagation velocity of the surface wave perpendicular to the direction of the wave 26, and $V_z$ the propagtion velocity in the direction of the wave 26, are not equal. When $$\tan \beta = \frac{V_z}{V_x}$$

the reflected rays 28 from each dot on a given line which are perpendicular to the direction of propagation forms a wave 30 that propagates toward the output transducer 24. The amplitude of the wave 30 is a function of the size and number of the dots on the line which gives rise to the wave 30. Each of the waves 30 formed by the lines of dots 23 add with weighting factors determined by the number and size of the dots 23 in each line and with relative phases which are a function of the spacing d along the direction of propagation between each line to form a wave 31 which is incident to the output transducer 24. In this manner, the transfer function between the lunched wave 26 and the output wave 31 is a function of the size and number of dots in each line and the spacing therebetween.

Figure 3:
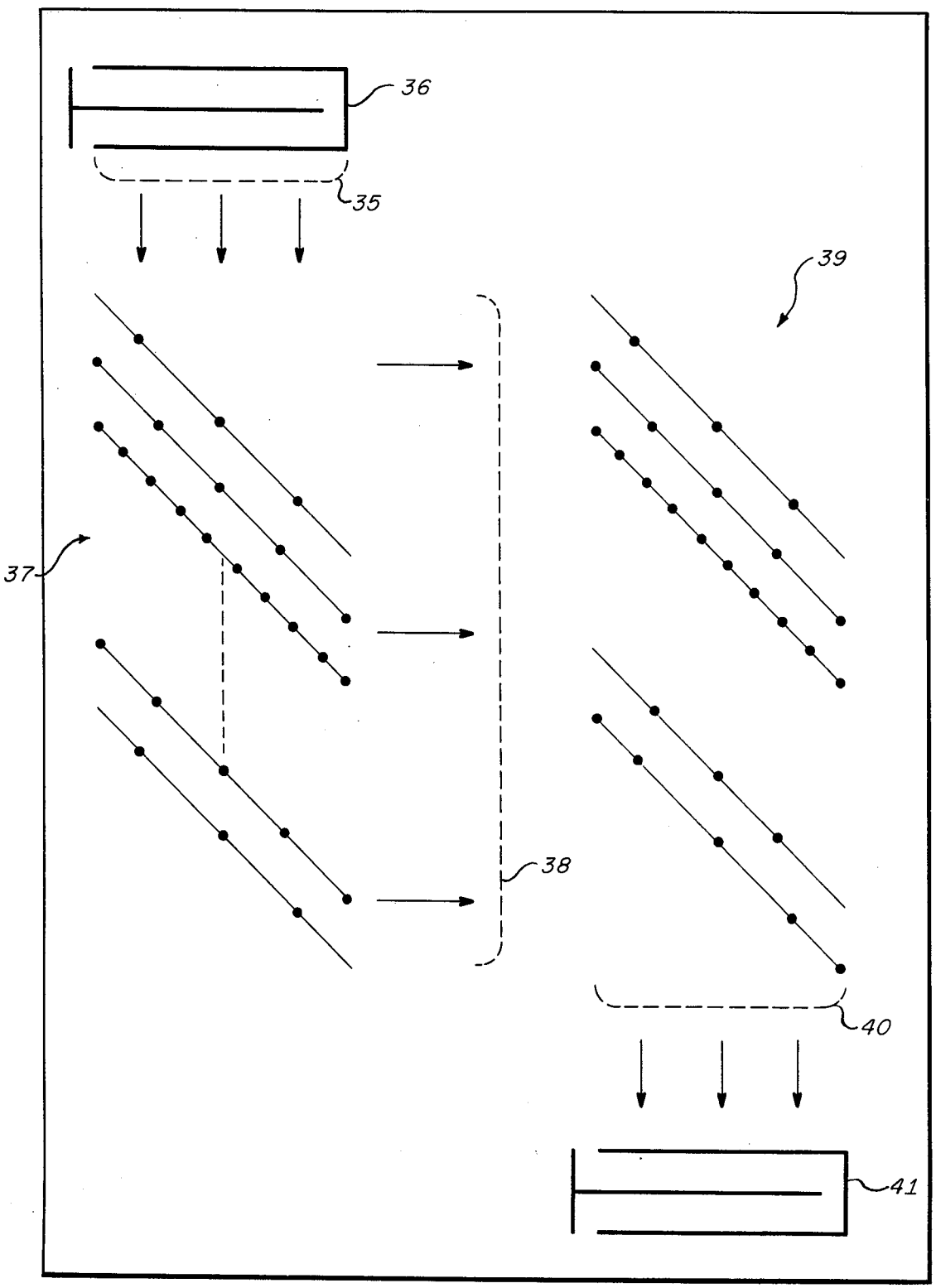

These devices may be cascaded as shown in FIG. 3 to provide multi-section processors. In FIG. 3 an acoustic wave 35, launched from transducer 36, is incident to an array of scatterers 37 from which a reflected wave 38 is incident to another array of scatters 39, from which a reflected wave 40 is incident to an output transducer 41. Though but two arrays are shown cascaded in FIG. 3, it should be obvious to one skilled in the art that any number may be so cascaded.

Though the invention has been described utilizing dots 23 positioned on parallel lines that are spaced a distance d apart, it will be understood by those skilled in the art that a processor may be designed utilizing the concepts of this invention by determining the relative position of each dot and establishing an area density of dots or a scattering strength for each dot in accordance with transfer function desired.

Since the dots 23 and the transducers 21 and 24 may be metallized on the substrate, standard photo-resist masking or other similar techniques may be used to fabricate the signal processor. This relatively economical construction maintains the advantages of the prior art etched groove construction and additionally eliminates the distortion of the response caused by multiple reflections between grooves since generally the multiple reflections between the dots 23 of the array 22 will not add coherently in the direction of propagation of the wave 31.

While the invention has been described in its preferred embodiment, it is to be understood that the words which have been used are words of description rather than limitation and that changes may be made within the purview of the appended claims without departing from the true scope and spirit of the invention in its broader aspects.

I claim:

1. An apparatus for processing acoustic waves comprising:
   a substrate capable of supporting surface acoustic waves on a surface thereof;
   an input transducer for launching acoustic waves in a predetermined propagation direction on said surface;
   an array formed by a multiplicity of discrete scatterers on said surface, each of which is of dimensions that are less than a wavelength of said launched acoustic waves and positioned to scatter surface acoustic waves launched in said predetermined direction, said scattered acoustic waves contributing to the formation of reflected surface waves, that propagate at a preselected angle relative to said propagation direction, which are related to said launched acoustic waves through a transfer function that is substantially defined by the dimensions of said scatterers and their relative positioning within said array; and
   an output transducer for receiving said reflected surface waves.

2. The apparatus of claim 1 wherein said substrate comprises a piezoelectric medium.

3. The apparatus of claim 2 wherein said piezoelectric medium is selected from the group consisting of bismuth germanium oxide, bismuth silicon oxide, lithium tentalate, and lithium niobate.

4. An apparatus in accordance with claim 1 wherein said input means and said output means comprise electrode pairs interdigitally positioned with essentially alternating instantaneous polarities.

5. An apparatus in accordance with claim 1 wherein said scatterers, said input means and said output means are metallized on said substrate.

6. Apparatus for processing acoustic signals in accordance with claim 1 further including a multiplicity of arrays each formed by a multiplicity of said discrete scatterers on said surface, the dimension of which and the array geometry of each array determining a transfer function, the first array of said multiplicity of arrays positioned on said substrate to receive said reflected acoustic waves from said array as incident acoustic waves thereto, with each array of said multiplicity of arrays positioned such that acoustic waves reflected from the array immediately preceding are incident thereto and wherein said output transducer is positioned on said substrate to receive acoustic waves reflected from the ultimate array of said multiplicity of arrays, whereby acoustic waves launched from said input transducer are processed sequentially by said array transfer functions such that said acoustic waves reflected from said ultimate array are related to said launched acoustic waves by a preselected transfer function.

7. An apparatus for processing acoustic signals in accordance with claim 1 wherein said scatterers are positioned to form discontinuous lines which include a plurality of said scatterers, all lines so formed being parallel with predetermined spacings therebetween and at a predetermined angle relative to said direction of propagation, the number and dimensions of said scatterers on each of said lines determining the fraction of incident acoustic signal energy reflected thereform, thereby establishing a weighting factor for acoustic waves reflected from said line which combines with weighted acoustic waves reflected from all other lines of said scatterers at a preselected angle of reflection from said lines, thereby establishing acoustic waves at said preselected preselected angle possessing a prespecified relationship to said acoustic waves launched in said predetermined direction.

8. An apparatus in accordance with claim 7 wherein said scatterers positioned to form a line are uniformly spaced thereon.

9. An apparatus in accordance with claim 7 wherein said scatterers positioned to form a line are non-uniformly spaced thereon.

10. An apparatus in accordance with claim 7 wherein said lines formed by said scatterers have uniform spacing therebetween.

11. Apparatus for processing acoustic signals in accordance with claim 8 wherein said lines formed by said scatterers have uniform spacing therebetween.

12. Apparatus for processing acoustic signals in accordance with claim 9 wherein said lines formed by said scatterers have uniform spacing therebetween.

13. Apparatus for processing acoustic signals in accordance with claim 7 wherein said preselected angle of reflection is substantially perpendicular to said predetermined propagation direction.

14. An apparatus for processing acoustic waves comprising:
- a substrate capable of supporting acoustic waves on a surface thereof;
- an input transducer for launching surface acoustic waves in a predetermined propagation direction on said surface;
- an array formed with a multiplicity of discrete scatterers on said surface, said scatterers positioned to form lines which include a plurality of said scatterers, all lines so formed being at a predetermined angle relative to said propagation direction and parallel with predetermined spacings therebetween, the number and dimensions of said scatterers on a line determining the percentage of incident acoustic wave energy reflected therefrom, thereby establishing a weighting factor for acoustic waves reflected from said line which combines with reflected acoustic waves from all other lines of said scatterers at a preselected angle of reflection from said lines, thereby establishing acoustic waves at said preselected angle possessing a prespecified relationship to said acoustic waves launched in said predetermined direction; and
- an output transducer for receiving said reflected acoustic waves.

15. An apparatus in accordance with claim 14 wherein said preselected angle of reflection is substantially perpendicular to said predetermined propagation direction.

16. An apparatus in accordance with claim 14 wherein said substrate means comprises a piezoelectric medium.

17. Apparatus as described in claim 16 wherein said substrate comprises a piezoelectric medium selected from the group consisting of bismuth germanium oxide, bismuth silicon oxide, lithium tentalate, and lithium niobate.

18. An apparatus in accordance with claim 14 wherein said input transducer and said output transducer comprise electrode pairs interdigitally positioned with substantially alternating instantaneous polarities.

19. An apparatus in accordance with claim 14 wherein said scatterers, said input transducer and said output transducer are metallized on said substrate.

20. Apparatus for processing acoustic signals in accordance with claim 14 further including a multiplicity of arrays each formed by a multiplicity of said discrete scatterers on said surface, the dimension of which and the array geometry of each array determining a transfer function, the first array of said multiplicity of arrays positioned on said substrate to receive said reflected acoustic waves from said array as incident acoustic waves thereto, with each array of said multiplicity of arrays positioned such that acoustic waves reflected from the array immediately preceding are incident thereto and wherein said output transducer is positioned on said substrate to receive acoustic waves reflected from the ultimate array of said multiplicity of arrays, whereby acoustic waves launched from said input transducer are processed sequentially by said array transfer functions such that said acoustic waves reflected from said ultimate array are related to said launched acoustic waves by a preselected transfer function.

21. An apparatus in accordance with claim 14 wherein said scatterers positioned to form a line are uniformly spaced thereon.

22. An apparatus for processing acoustic signals in accordance with claim 14 wherein said scatterers positioned to form a line are non-uniformly spaced thereon.

23. An apparatus in accordance with claim 14 wherein said lines formed by said scatterers have uniform spacing therebetween.

24. Apparatus for processing acoustic signals in accordance with claim 21 wherein said lines formed by said scatterers have uniform spacing therebetween.

25. Apparatus for processing acoustic signals in accordance with claim 22 wherein said lines formed by said scatterers have uniform spacing therebetween.